(12) United States Patent  (10) Patent No.: US 7,572,702 B2
Yoon  (45) Date of Patent: Aug. 11, 2009

(54) SPLIT GATE TYPE NON-VOLATILE MEMORY DEVICE

(75) Inventor: Chul Jin Yoon, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 114 days.

(21) Appl. No.: 11/616,816

(22) Filed: Dec. 27, 2006

(65) Prior Publication Data

US 2007/0145469 A1 Jun. 28, 2007

(30) Foreign Application Priority Data

Dec. 28, 2005 (KR) .............. 10-2005-0131476

(51) Int. Cl.
*H01L 21/336* (2006.01)
(52) U.S. Cl. ............... 438/267; 438/595; 257/E21.682
(58) Field of Classification Search ............... 438/257, 438/267, 283, 266, 596, 595; 257/316, 365, 257/E21.645, E21.68, E21.682
See application file for complete search history.

(56) References Cited

U.S. PATENT DOCUMENTS

| 6,737,700 | B1 * | 5/2004 | Chang et al. | 257/315 |
| 6,821,849 | B2 * | 11/2004 | Chang et al. | 438/266 |
| 6,838,343 | B2 * | 1/2005 | Hung et al. | 438/257 |
| 7,166,511 | B2 * | 1/2007 | Oh | 438/257 |
| 7,169,672 | B1 * | 1/2007 | Jung | 438/266 |
| 2001/0015455 | A1 * | 8/2001 | Hsieh et al. | 257/315 |
| 2003/0054611 | A1 * | 3/2003 | Kanaya | 438/266 |
| 2003/0214864 | A1 * | 11/2003 | Lee et al. | 365/200 |
| 2004/0171217 | A1 * | 9/2004 | Chung et al. | 438/257 |
| 2004/0196720 | A1 * | 10/2004 | Hung et al. | 365/222 |
| 2005/0142758 | A1 * | 6/2005 | Jung | 438/258 |
| 2006/0197145 | A1 * | 9/2006 | Pittikoun et al. | 257/316 |

OTHER PUBLICATIONS (Quirk et al., Semiconductor Manufacturing Technology, Prentice Hall, 2001 p. 226 & 231).*

* cited by examiner

*Primary Examiner*—W. David Coleman
*Assistant Examiner*—Latanya Crawford
(74) *Attorney, Agent, or Firm*—Sherr & Vaughn, PLLC

(57) ABSTRACT

Embodiments relate to a gate structure of a split gate-type non-volatile memory device and a method of manufacturing the same. In embodiments, the split gate-type non-volatile memory device may include a device isolation layer formed on a semiconductor substrate in the direction of a bit line to define an active region, a pair of first conductive layer patterns formed on the active region, a charge storage layer interposed between the pair of first conductive layer patterns and the active region, a pair of second conductive layer pattern formed on the active region and extended along the one sidewalls of the pair of first conductive layer patterns in the direction parallel to a word line, and a gate insulating layer interposed between the pair of second conductive layer patterns and the active region. The pair of second conductive layer patterns may be formed on one sidewalls of the pair of first conductive layer patterns in the form of spacers.

1 Claim, 7 Drawing Sheets

SPLIT GATE TYPE NON-VOLATILE MEMORY DEVICE

The present application claims priority under 35 U.S.C. 119 and 35 U.S.C. 365 to Korean Patent Application No. 10-2005-0131476 (filed on Dec. 28, 2005), which is hereby incorporated by reference in its entirety.

BACKGROUND

A non-volatile memory device may be able to electrically erase and store data, and may be able to store data even when power is not supplied. Because of this ability, applications of non-volatile memory may be important in various fields. The non-volatile memory device may be divided into a NAND-type non-volatile memory device and a NOR-type non-volatile memory device. The NAND-type non-volatile memory device may be used for storing data. The NOR-type non-volatile memory device may be used for booting up various systems.

In a NOR-type non-volatile memory device, a plurality of memory cells, which may constitute a single transistor, may be connected to one bit line in parallel. One memory cell transistor may be connected between a drain connected to a bit line and a source region connected to a common source line. In the NOR-type non-volatile memory device, a current of a memory cell may be high, the memory cell may operate at high speed, and a contact of the bit line and the common source line may occupy a large area. Accordingly, it may be difficult for a NOR-type non-volatile memory device to be highly integrated.

In the NOR type non-volatile memory device, the memory cells may be connected to the bit line in parallel. Accordingly, if the threshold voltage of the memory cell transistor is lower than a voltage (commonly 0V) applied to the word line of a non-selected memory cell, current may flow between a source and a drain regardless of whether a selected memory cell is turned on or off. In this instance, all memory cells may be read to be turned on. To solve such a problem, a non-volatile memory device referred to as a split-gate type may be used.

A non-volatile memory device may be divided into a flash memory device, which may have a laminated gate of a FLOTOX structure, and a SONOS device, which may have a structure similar to that of a MOS transistor and may include a multi-layer gate insulating layer. The gate insulating layer of the SONOS device may be a multi-layer charge storage insulating layer and may have a structure in which a silicon oxide layer, a silicon nitride layer, and a silicon oxide layer may be sequentially laminated (oxide-nitride-oxide (ONO) layer). Since charges may be stored in a deep level trap that a nitride layer has, the SONOS device may have a higher reliability than the flash memory device. Moreover, SONOS devices may be capable of performing writing and erasing operations at a low voltage.

Figure 1A:
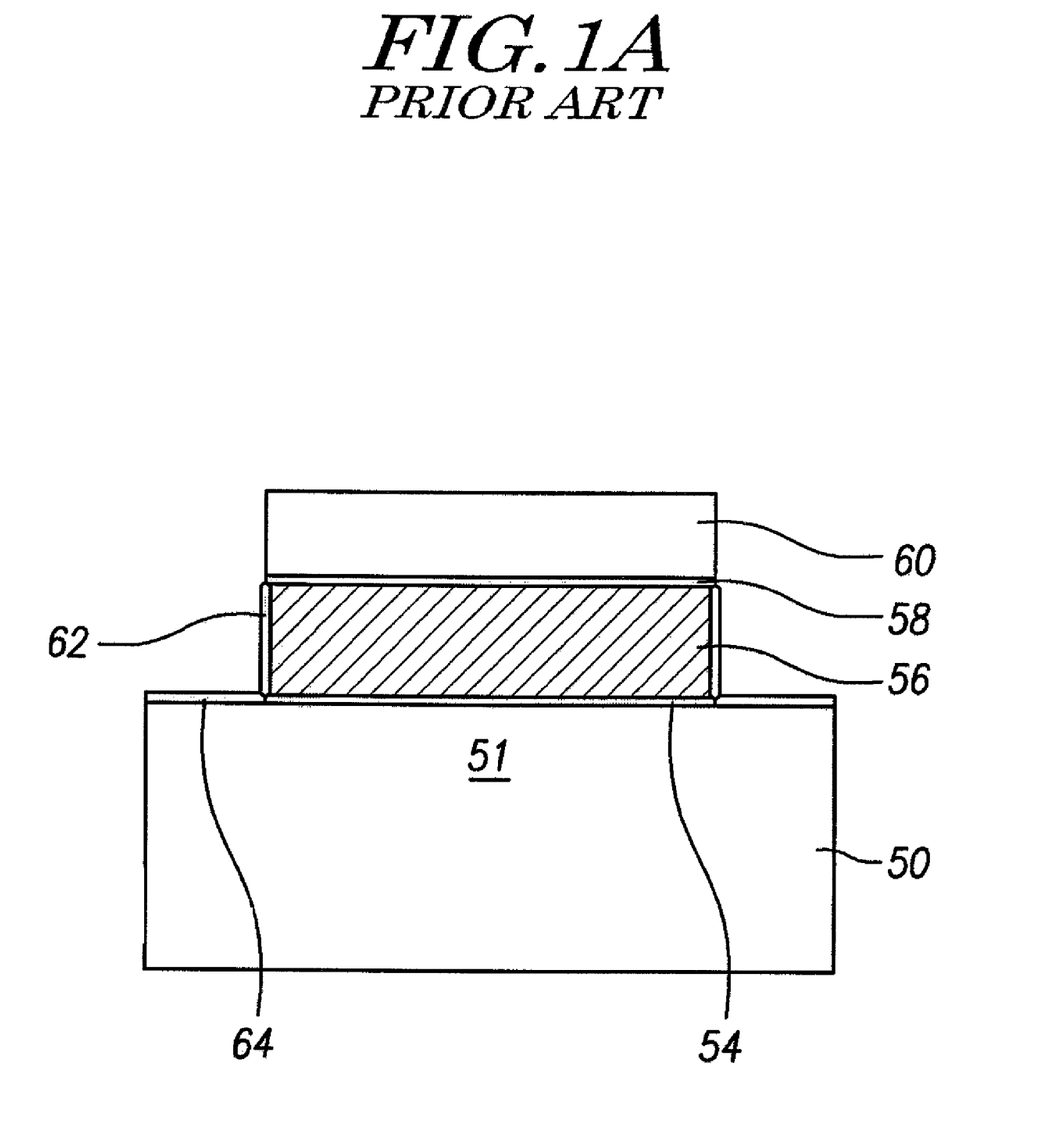
FIGS. 1A to 1C are example of diagrams illustrating a method of manufacturing a related art split gate-type non-volatile memory device.
Figure 1B:
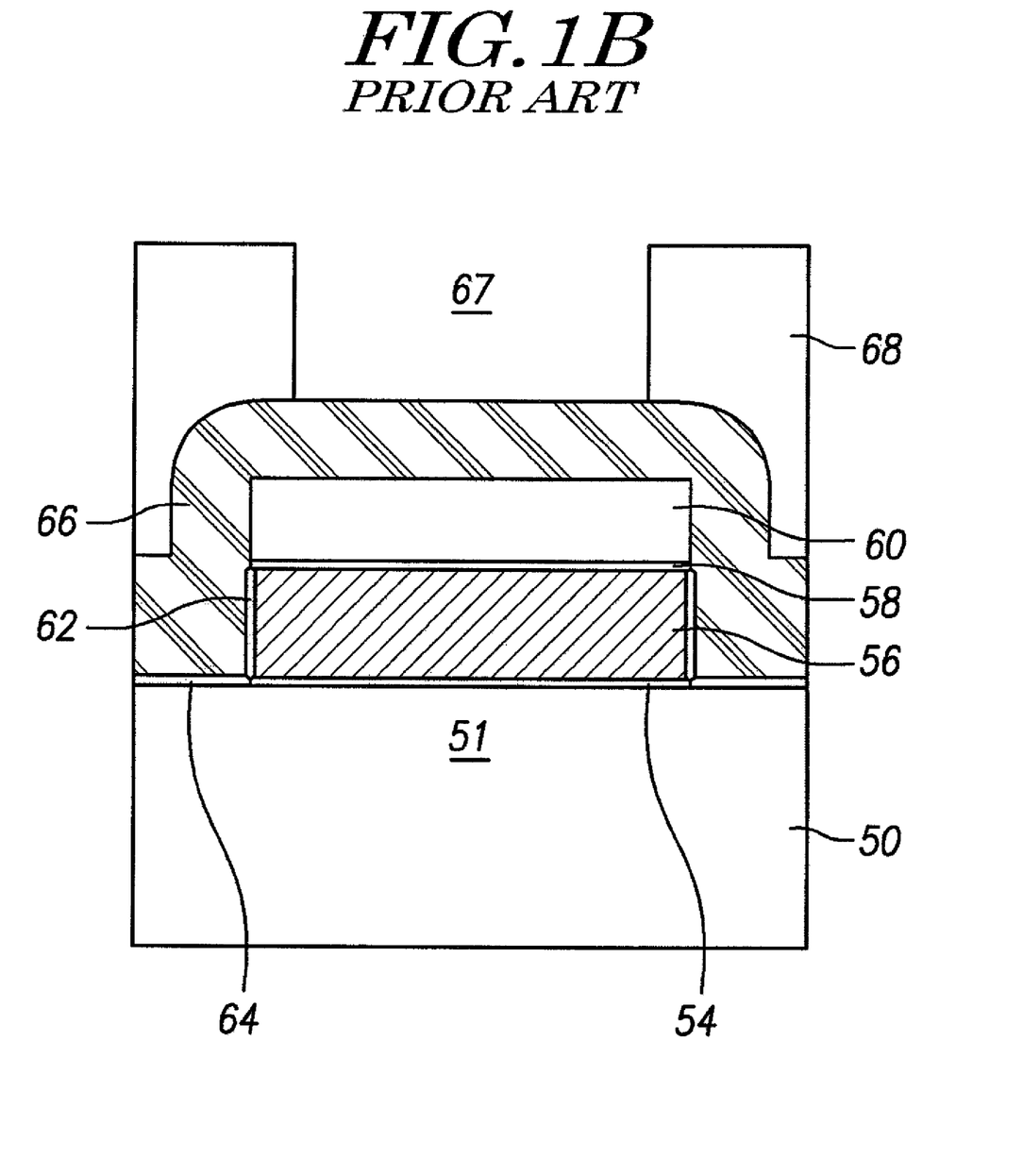
Figure 1C:
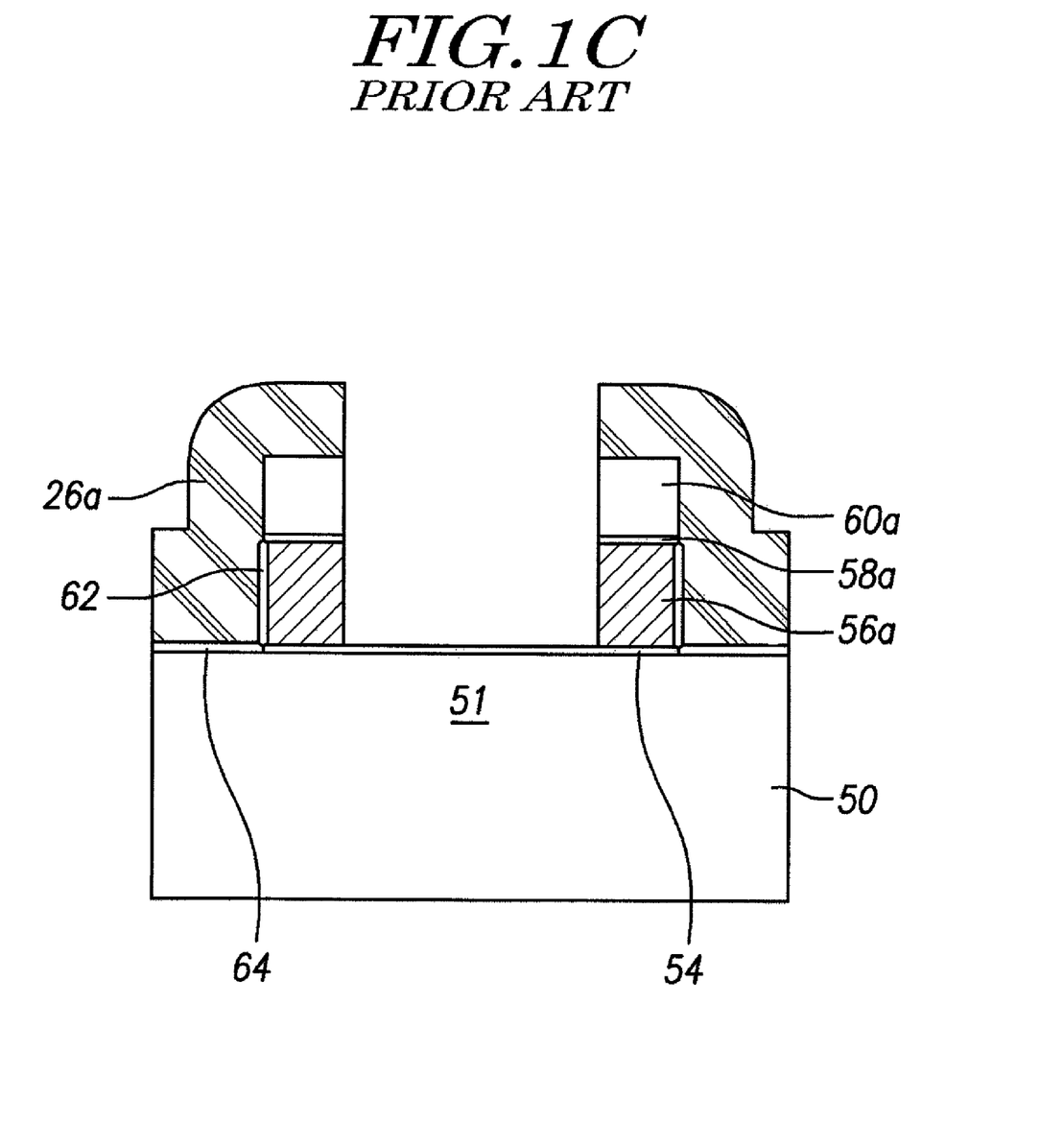

FIGS. 1A to 1C illustrate an example method of manufacturing a related art split gate-type non-volatile memory device.

Referring to FIG. 1A, a device isolation layer (not shown) may be formed in the direction of a bit line in parallel on semiconductor substrate 50, and may limit active region 51. Multi-layer charge storage layer 54, first conductive layer 56, and capping layers 58 and 60 may be formed to be parallel to a word line with a prescribed width on semiconductor substrate 50. In embodiments, the ONO layer may be used as the charge storage layer. In embodiments, capping layers may be formed by laminating silicon oxide layer 58, which may function as a buffer, and silicon nitride layer 60 used as a hard mask. Then, to form first conductive layer 56, to cure damaged sidewalls, an oxide process may be performed on the sidewalls of first conductive layer 56 to form sidewall insulating layers 62.

The multi-layer charge storage layer exposed on active region 51 may be removed, excluding portions of multi-layer charge storage layer 54 under first conductive layer 56. Gate insulating layer 64 may be formed on the exposed active region of the substrate.

Referring to FIG. 1B, second conductive layer 66 may be formed on gate insulating layer 64 and first conductive layer 56 (including silicon oxide layer 58 and silicon nitride layer 60). Photoresist pattern 68, which may have opening 67, may be formed on second conductive layer 66. Photoresist pattern 68 may be formed so that opening 67 may limit tops of first conductive layer 56 and active region 51. Part of second conductive layer 66 may be exposed by opening 67.

Referring to FIG. 1C, second conductive layer 66 may be etched using photoresist pattern 68 as an etching mask and the various layers (capping layers 58, 60, first conductive layer 56, and ONO layer 54) under second conductive layer 66 may be simultaneously etched. Therefore, a pair of split gates, including ONO layer 54, first conductive layer patterns 56a, capping layer patterns 58a and 60a, and second conductive layer patterns 66a, may be formed in active region 51 of the substrate. The split gates may extend from a top of capping layer pattern 60a to gate insulating layer 64, covering sidewalls of first conductive layer patterns 56a (including sidewall insulating layers 62), and may be formed in active region 51 of the substrate. The pair of split gates may constitute the word line and may be perpendicular to the bit line.

Figure 2:
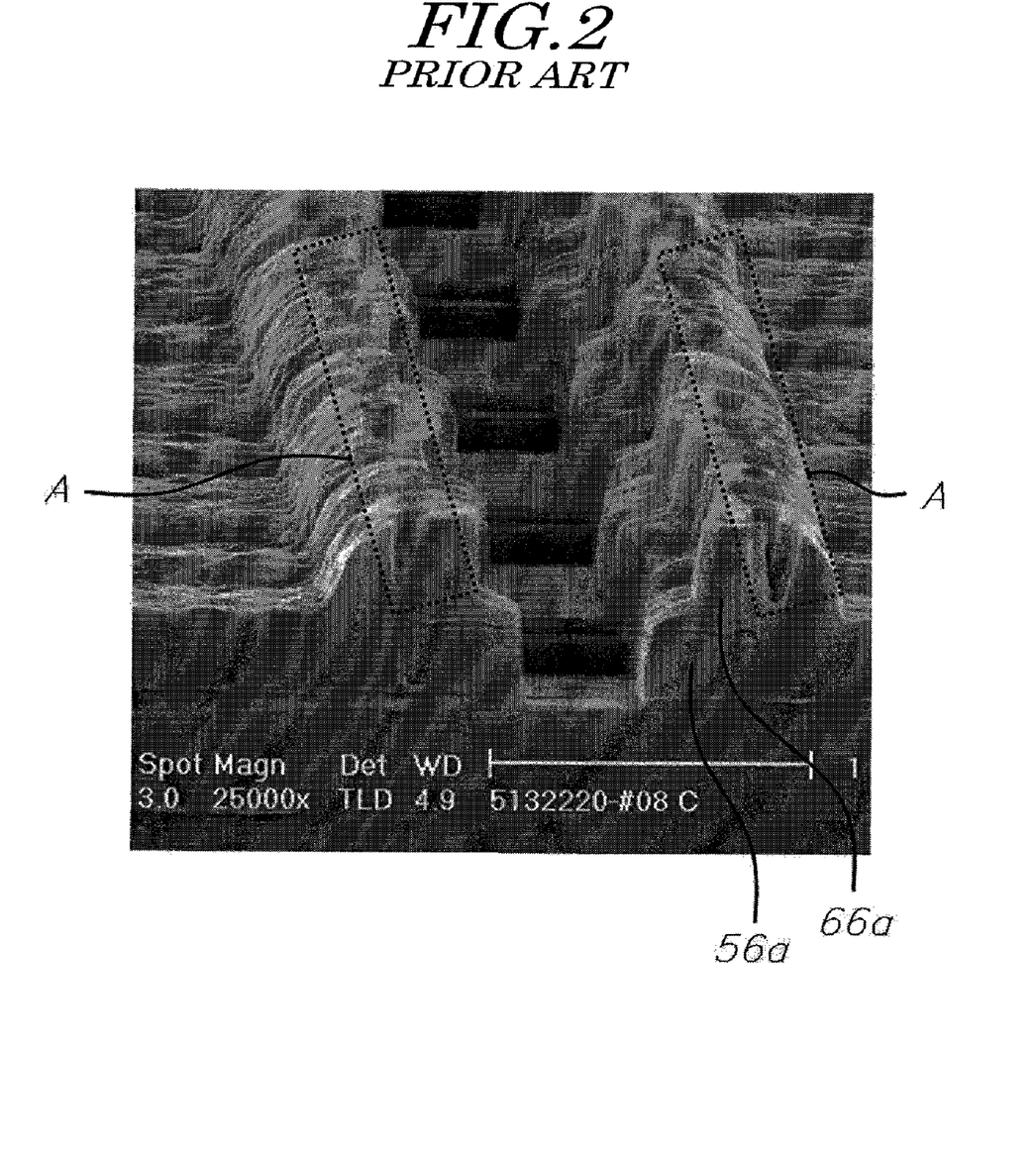
FIG. 2 is an example image showing damage to a top of a selected gate that may occur from an etching process when a split gate is formed by the method illustrated in FIGS. 1A to 1C.

In the related art method, first conductive layer 56 and second conductive layer 66 may be formed, and may be etched in a single etching process. However, when the various layers are laminated, a step difference between the objects may be very high. Hence, it may be necessary to use etching equipment having high etching rate. A top of second conductive layer 66, which may be the uppermost layer, may therefore be damaged. That is, if photoresist 68 formed on second conductive layer 66 is not thick enough, photoresist 68 may be substantially or completely consumed during the etching process. A top of second conductive layer 66 may therefore be revealed. Hence, second conductive layer 66 may not be able to withstand the high etching rate, and may be damaged. FIG. 2 illustrates the potential damage to tops of conductive layer patterns 66a in the region A.

SUMMARY

Embodiments relate to a semiconductor device and a method of manufacturing the same. Embodiments relate to a split gate type non-volatile memory device and a method of manufacturing the same.

Embodiments relate to a split gate-type non-volatile memory device in which second conductive layer patterns that constitute a word line may be formed on the sidewalls of first conductive layer patterns in the form of spacers so that it may be possible to prevent the top of a second conductive layer from being damaged when a first conductive layer is patterned.

According to embodiments, a split gate-type non-volatile memory device may include a device isolation layer formed on a semiconductor substrate in the direction of a bit line to define an active region, a pair of first conductive layer patterns formed on the active region, a charge storage layer interposed between the pair of first conductive layer patterns and the active region, a pair of second conductive layer pattern formed on the active region and extended along the one sidewalls of the pair of first conductive layer patterns in the direction parallel to a word line, and a gate insulating layer interposed between the pair of second conductive layer patterns and the active region. The pair of second conductive layer patterns may be formed on one sidewalls of the pair of first conductive layer patterns in the form of spacers.

In embodiments, sidewall insulating layers may be formed on the sidewalls of the pair of first conductive layer patterns. In embodiments, the second conductive layer patterns may be electrically connected to the first conductive layer patterns by the sidewall insulating layers. In embodiments, capping insulating layers may be formed on the first conductive layer patterns. The second conductive layer patterns may be electrically insulated from the first conductive layer by the capping insulating layers.

According to embodiments, a method of manufacturing a non-volatile memory device may include limiting an active region on a semiconductor substrate, forming a charge storage layer and a first conductive layer having a prescribed width on the active region, forming a second conductive layer on the first conductive layer and the active region positioned on the right and left of the first conductive layer to be conformal, forming a pair of second conductive layer patterns on both sidewalls of the first conductive layer by etching back the second conductive layer, forming a photoresist pattern with an opening that crosses the active region on the first conductive layer, and forming a pair of conductive layer patterns by etching the first conductive layer using the photoresist pattern as an etching mask. In embodiments, the pair of second conductive layer patters may be formed on the right and left sidewalls of the first conductive layer in the form of spacers.

In embodiments, before forming the second conductive layer, sidewall insulating layers may be formed on the right and left sidewalls of the first conductive layer. In embodiments, a gate insulating layer may be formed on the active region position on the right and left sides of the first conductive layer. Also, a capping insulating layer may be formed on the first conductive layer.

DETAILED DESCRIPTION OF EMBODIMENTS

Figure 3A:
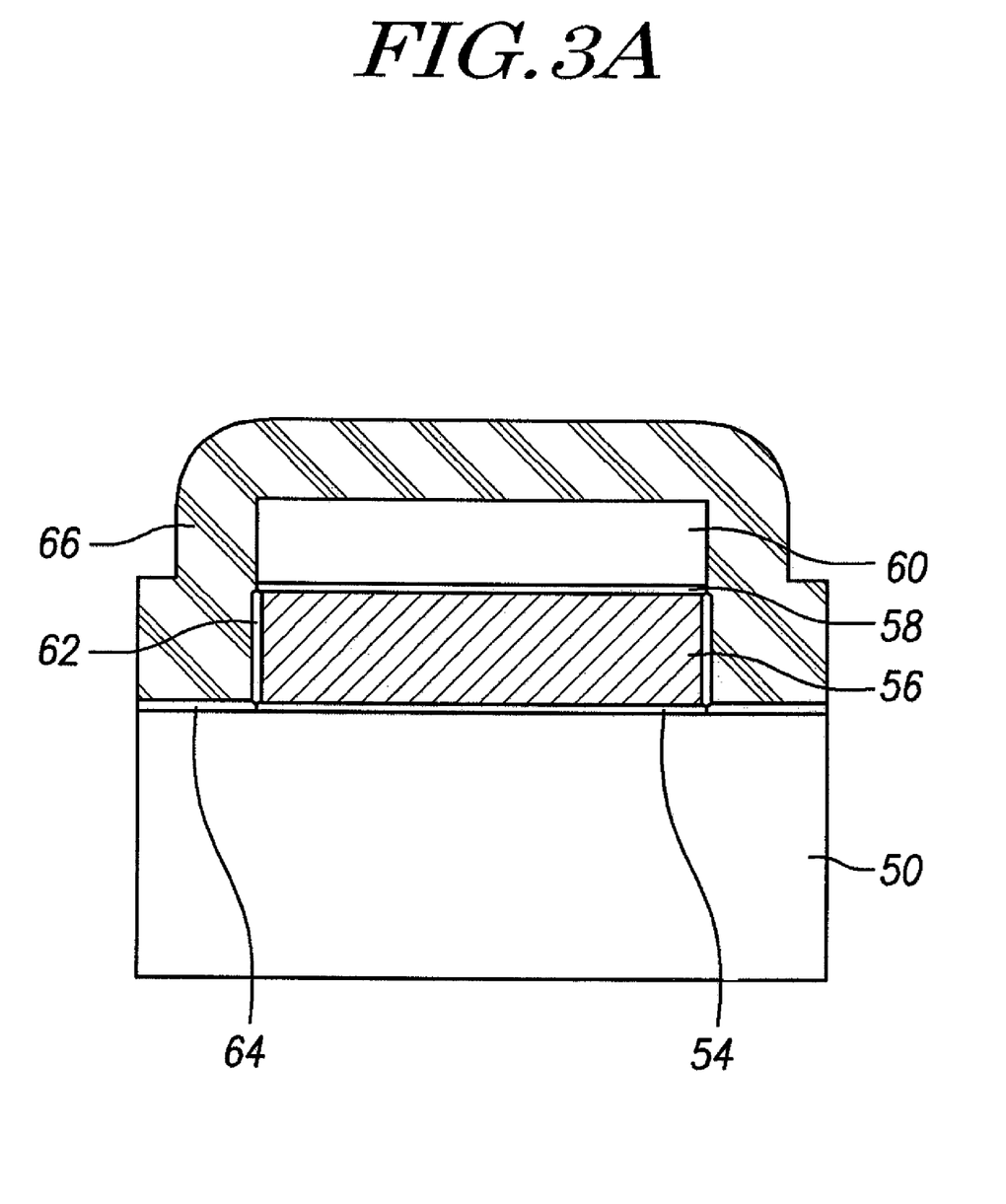
FIGS. 3A to 3C are example diagrams illustrating a split gate-type non-volatile memory device and a method of manufacturing a split gate-type non-volatile memory device according to embodiments.
Figure 3B:
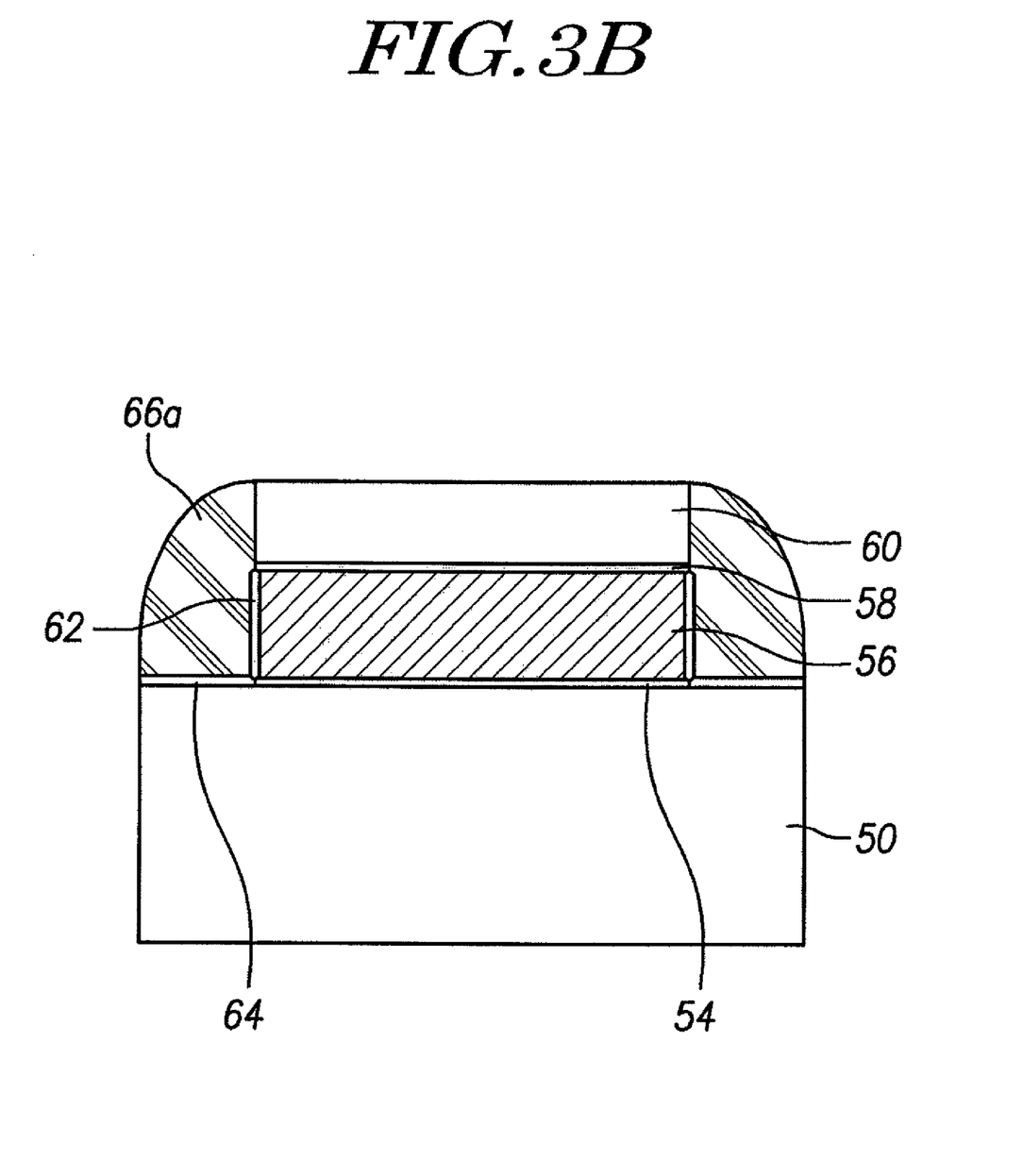
Figure 3C:
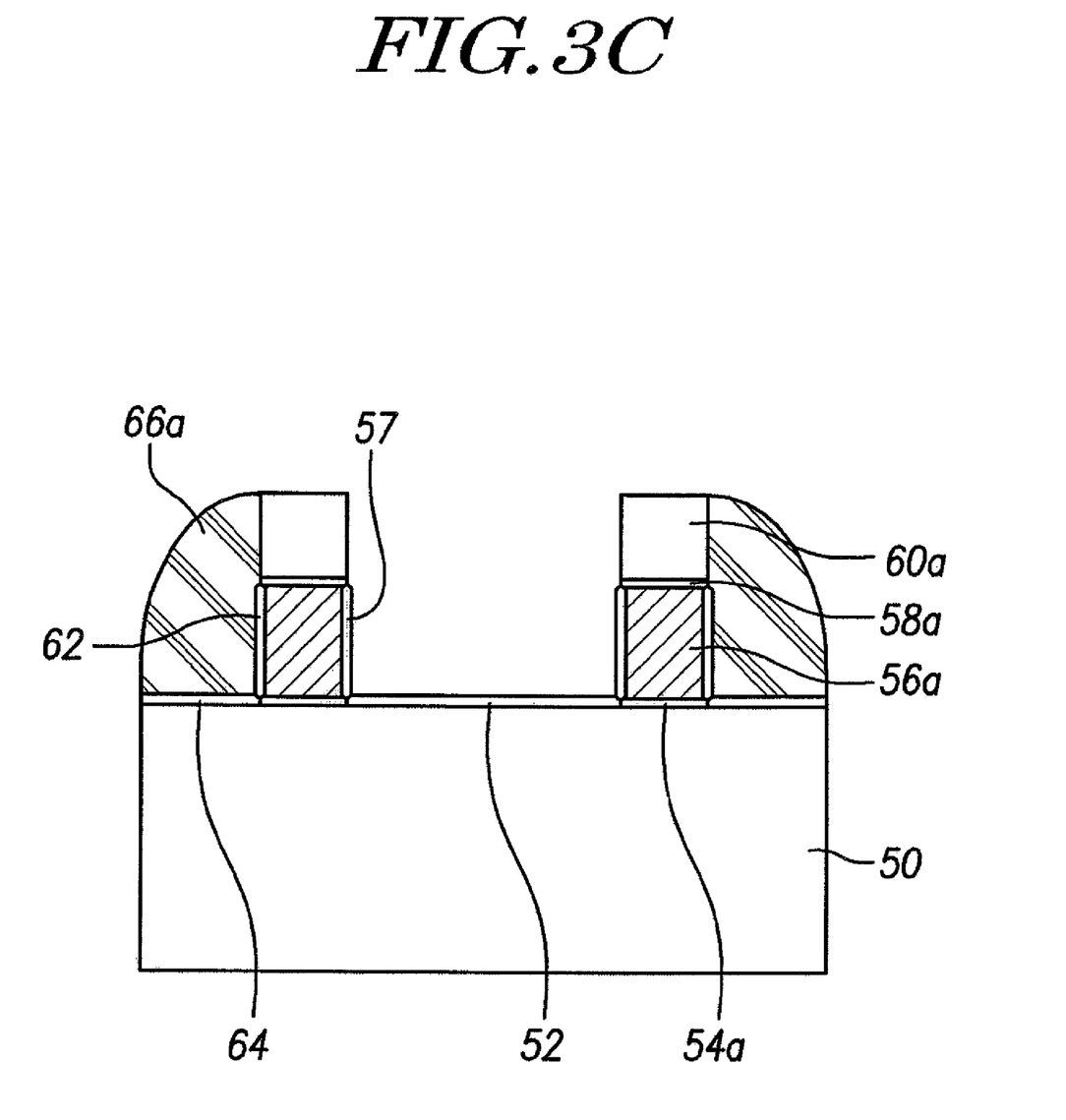

Referring to FIG. 3C, a pair of first conductive layer patterns 56a may be formed to be adjacent to each other in an active region of a semiconductor substrate. Inside sidewalls of first conductive layer patterns 56a may face each other. Second conductive layer patterns 66a may be formed on the active region adjacent to outside portions of sidewalls of first conductive layer patterns 56a. Multi-layer charge storage layer 54 may be interposed between first conductive layer patterns 56a and a surface of substrate 50 in the active region. Gate insulating layer 64 may be interposed between second conductive layer patterns 66a and a surface of substrate 50 in the active region. Multi-layer charge storage layer 54 may be formed of an ONO layer formed of a silicon oxide layer-silicon nitride layer-silicon oxide layer, according to embodiments. In embodiments, multi-layer charge storage layer 54 may be patterned to form multi-layer charge storage layer patterns 54a below first conductive layer patterns 56a, and an oxide layer 52 may be provided on substrate 50 between the pair of first conductive layer patterns 56a.

Capping insulating layer patterns 58a and 60a may be formed on first conductive layer patterns 56a. Sidewall insulating layers 62 may be interposed between the sidewalls adjacent to second conductive layer patterns 66a and may electrically insulate first conductive layer patterns 56a from second conductive layer patterns 66a.

Sidewall insulating layers 57 may be formed on inside portions of opposing sidewalls of first conductive layer patterns 56a that are not adjacent to second conductive layer patterns 66a. Sidewall insulating layers 57 may face each other. Second conductive layer patterns 66a may cross a top of the active region to be parallel to the word line. In embodiments, second conductive layer patterns 66a may be formed as spacers on sidewalls adjacent to first conductive layer patterns 56a. In embodiments, second conductive layer patterns 66a may be formed on outer sides of capping insulating layer pattern 60a but may not be formed on a top surface of capping insulating layer pattern 60a.

Referring to FIGS. 3A to 3C, a method of forming the split gate according to embodiments will be described.

Referring to FIG. 3A, charge storage layer 54, first conductive layer 56, and capping insulating layers 58 and 60 may be sequentially laminated on silicon substrate 50. Charge storage layer 54, first conductive layer 56, and capping insulating layers 58 and 60 may be formed by sequentially forming the layers on a surface of the substrate and by patterning the layers to have a prescribed with. Sidewall insulating layers 62 and gate insulating layer 64 may be formed on left and right sidewalls of first conductive layer 56 and the active region of the substrate, respectively. Sidewall insulating layers 62 and gate insulating layer 64 may be formed, for example by oxidizing a polysilicon layer and silicon substrate 50 by a thermal oxidation process. After forming sidewall insulating layers 62 and gate insulating layer 64, second conductive layer 66 may be formed on the substrate and capping insulating layer 60 and may be be conformal.

Referring to FIG. 3B, portions of second conductive layer 66 may be etched, for example through an etch back process. This may form second conductive layer patterns 66a that may be left on the sidewalls of first conductive layer 56, and may also be on sidewalls of capping insulating layers 50 and 60. Second conductive layer patterns 66a may be formed over gate insulating layer 64. In embodiments, sidewall insulating layer 62 may be interposed between first conductive layer 56 and second conductive layer 66. Hence, after performing the etch-back process, as illustrated in FIG. 3B, second conductive layer 66 may be formed to second conductive patterns 66a in the form of spacers. In embodiments, second conductive layer patterns 66a may be formed on outer sides of capping insulating layer 50 and 60 but may be etched off of a top surface of capping insulating layer 60.

After forming second conductive layer patterns 66a, a photoresist pattern (not shown), that may have an opening that may limit a part of first conductive layer 56, may be formed. The photoresist pattern may have an opening parallel to the word line, and accordingly the opening may cross a plurality of active regions. Capping insulating layers 58 and 60, first conductive layer 56, and ONO layer 54 may be sequentially etched using the photoresist pattern as an etching mask. Capping layer patterns 58a and 60a, first conductive layer patterns 56a, and ONO layer patterns 54a, as illustrated in FIG. 3C, may thus be formed. Photoresist pattern may then be stripped. Sidewall insulating layers 57 and oxide layer 52 may be formed on the exposed one sidewalls of first conductive layer patterns 56a and on the exposed region of substrate 50.

In the etching process illustrated in FIG. 3C, a multi-layer structure, including first conductive layer 56, may be etched. Since second conductive layer 66 may not be included in the multi-layer structure, a step difference may relatively small. For example, the step difference may be much less than that of the related art. Also, since second conductive layer patterns 66a may be formed only on the sidewalls of first conductive layer patterns 56a, second conductive layer patterns 66a may be sufficiently protected by the photoresist pattern in the etching process of patterning first conductive layer 56. Therefore, second conductive layer patterns 66a may not be damaged. Accordingly, it may be possible to form a reliable split gate.

According to embodiments, second conductive layer patterns 66a, that constitute the word line, may be formed on sidewalls of first conductive layer patterns 56a in the form of spacers. Therefore, it may not be necessary to pattern the first conductive layer and the second conductive layer through one etching process. Hence, it may be possible to prevent a top of the second conductive layer from being damaged by an excessive etching rate.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:

sequentially forming a first conductive layer and a capping insulating layer on a substrate;

forming first insulating layers on an outer sidewall of the first conductive layer and gate insulating layers on the active region of the substrate by performing a first thermal oxidation process on the first conductive layer and the substrate;

forming a second conductive layer on the substrate including directly on and contacting the gate insulating layer and the capping insulating layer;

forming second conductive layer patterns directly contacting the outer sidewall of the first insulating layers and the capping insulating layer by performing a first etching process to expose the entire uppermost surface of the capping insulating layer;

forming capping layer patterns and first conductive layer patterns after forming the second conductive layer patterns by performing a second etching process on the capping insulating layer and the first conductive layer to thereby expose a portion of the uppermost surface of the substrate;

forming second sidewall insulating layers on an inner sidewall of the first conductive layer patterns and an oxide layer on the exposed portion of the substrate.

* * * * *